United States Patent
Hoshikawa et al.

(10) Patent No.: US 7,514,483 B2
(45) Date of Patent: Apr. 7, 2009

(54) AQUEOUS DISPERSION OF POLYTETRAFLUOROETHYLENE AND PROCESS FOR ITS PRODUCTION

(75) Inventors: Jun Hoshikawa, Ichihara (JP); Shinya Higuchi, Ichihara (JP); Yasuhiko Matsuoka, Ichihara (JP)

(73) Assignee: Asahi Glass Company, Limited, Tokyo (JP)

( * ) Notice: Subject to any disclaimer, the term of this patent is extended or adjusted under 35 U.S.C. 154(b) by 370 days.

(21) Appl. No.: 11/282,625

(22) Filed: Nov. 21, 2005

(65) Prior Publication Data
US 2007/0015857 A1    Jan. 18, 2007

(30) Foreign Application Priority Data
Jul. 13, 2005    (JP)    ............................. 2005-203953

(51) Int. Cl.
*C08F 1/00*    (2006.01)
(52) U.S. Cl. ..................... 523/310; 210/662; 524/544; 526/243; 554/191
(58) Field of Classification Search ................. 523/310; 524/544; 554/191; 526/243; 210/662
See application file for complete search history.

(56) References Cited

U.S. PATENT DOCUMENTS

| | | | |
|---|---|---|---|
| 4,369,266 A | | 1/1983 | Kuhls et al. |
| 6,825,250 B2 * | | 11/2004 | Epsch et al. ................. 523/310 |
| 6,833,403 B1 * | | 12/2004 | Bladel et al. ................. 524/458 |
| 6,833,414 B2 * | | 12/2004 | Granel et al. ................ 525/479 |
| 6,861,466 B2 * | | 3/2005 | Dadalas et al. ............... 524/544 |
| 2005/0004318 A1 * | | 1/2005 | Ohshiro et al. ........... 525/329.1 |
| 2005/0189299 A1 * | | 9/2005 | Malvasi et al. .............. 210/663 |
| 2006/0128872 A1 * | | 6/2006 | Zipplies et al. ............. 524/545 |
| 2006/0135654 A1 * | | 6/2006 | Swearingen et al. ........ 523/310 |
| 2006/0175261 A1 * | | 8/2006 | Noelke et al. ............... 210/662 |
| 2006/0183842 A1 * | | 8/2006 | Johnson ...................... 524/544 |
| 2007/0015857 A1 | | 1/2007 | Hoshikawa et al. |
| 2007/0015864 A1 | | 1/2007 | Hintzer et al. |

FOREIGN PATENT DOCUMENTS

| JP | 55-120630 | 9/1980 |
|---|---|---|
| JP | 2000-198899 | 7/2000 |
| JP | 2001-89624 | 4/2001 |
| JP | 2002-58966 | 2/2002 |
| JP | 2003-119204 | 4/2003 |
| JP | 2003-268034 | 9/2003 |
| JP | 2005-8775 | 1/2005 |
| JP | 2005-501956 | 1/2005 |
| WO | WO 00/35971 | 6/2000 |
| WO | WO 03/020836 A1 | 3/2003 |
| WO | WO 03/078479 A1 | 9/2003 |

OTHER PUBLICATIONS

U.S. Appl. No. 11/766,848, filed Jul. 12, 2007, Hoshikawa, et al.
T. Suwa, et al., "Melting and Crystallization behavior of Poly (tetrafluoroethylene). New Method for Molecular Weight Measurement of Poly (tetrafluoroethylene). Using a Differential Scanning Calorimeter", Journal of Applied Polymer Science, vol. 17, 1973, pp. 3253-3257.
U.S. Appl. No. 11/414,400, filed May 1, 2006, Hoshikawa, et al.
U.S. Appl. No. 11/282,625, filed Nov. 21, 2005, Hoshikawa, et al.
U.S. Appl. No. 11/282,625, filed Apr. 21, 2008, Hoshikawa, et al.
Takaomi Satokawa, Handbook of Fluorine resins, Nov. 30, 1990, pp. 28-29.
Takaomi Satokawa, Handbook of Fluorine resins, Nov. 30, 1990, pp. 32-33.

* cited by examiner

*Primary Examiner*—Peter D. Mulcahy
*Assistant Examiner*—Henry Hu
(74) *Attorney, Agent, or Firm*—Oblon, Spivak, McClelland, Maier & Neustadt, P.C.

(57) ABSTRACT

An aqueous dispersion of polytetrafluoroethylene (PTFE) comprising from 55 to 70 mass % of PTFE fine particles having an average particle diameter of from 0.1 to 0.5 μm, from 0.0001 to 0.02 mass %, based on PTFE, of a specific C8 fluorine-containing carboxylic acid salt (APFO) such as ammonium perfluorooctanoate, from 1 to 20 mass %, based on PTFE, of a specific nonionic surfactant and from 0.01 to 0.3 mass %, based on PTFE, of a specific $C_{5-7}$ fluorine-containing carboxylic acid salt such as ammonium perfluorohexanoate. The aqueous dispersion of PTFE has excellent properties which can form crack-resistant coatings which do not undergo coloration during baking or form problematic ionic impurities by improving the friction stability of aqueous PTFE dispersions even at APFO concentrations without viscosity increase.

20 Claims, No Drawings

AQUEOUS DISPERSION OF POLYTETRAFLUOROETHYLENE AND PROCESS FOR ITS PRODUCTION

TECHNICAL FIELD

The present invention relates to an aqueous dispersion of polytetrafluoroethylene (hereinafter referred to as PTFE) and a process for its production.

BACKGROUND ART

An emulsion polymerized PTFE is obtained by polymerizing the tetrafluoroethylene (hereinafter referred to as TFE) monomer, in the presence of pure water, a polymerization initiator, a fluorine-containing anionic surfactant (hereinafter referred to as APFO) having 8 carbon atoms in total such as ammonium perfluorooctanoate and a paraffin wax stabilizer, and it is obtained as an aqueous PTFE polymer emulsion containing PTFE fine particles (Handbook of Fluorine resins, p. 28, edited by Takaomi Satokawa, published by Nikkankogyo Shimbun).

The aqueous PTFE polymer emulsion after the polymerization is used as a low concentration aqueous PTFE dispersion after blended with a nonionic surfactant, as a high concentration aqueous PTFE dispersion after concentration, or as an aqueous PTFE dispersion after blended with a nonionic surfactant, a filler or other known components as the case requires. However, it has not been industrially common to remove APFO from an aqueous dispersion of PTFE.

Because APFO is hardly naturally degradable, it is preferred to minimize the APFO content of products As to means of lowering the APFO content, WO00/35971 (JP-A-2002-532583) proposes a method of preparing an aqueous PTFE dispersion with a low APFO concentration using an ion exchange resin. The resulting aqueous PTFE dispersion having a low APFO concentration has a problem of poor friction stability.

An aqueous PTFE dispersion under friction or shearing tends to get less homogeneous, because the PTFE fine particles fibrillate and form agglomerates. Therefore, an aqueous PTFE dispersion having a low APFO concentration with poor friction stability can clog a feed pump or form an uneven or defective coating containing agglomerates.

In applications which require that an aqueous PTFE dispersion has wettability or has to form thick coatings, it has been conventional to add a large amount of a nonionic surfactant to an aqueous PTFE dispersion. For example, at low APFO concentrations, addition of from 6-12 mass %, based on PTFE, of a nonionic surfactant makes dispersions so viscous that they form problematically thick coatings or lowers the critical cracking thickness (the thickness at which cracking occurs in a thick coating) and has a problem that coatings tend to crack.

WO03/020836 (JP-A-2005-501956) proposes adjustment of the viscosity of an aqueous PTFE dispersion by addition of a fluorine-free anionic surfactant. However, when sodium lauryl sulfate, which is a sulfur-containing anionic surfactant given as an example therein, is used, a coating turns yellowish brown during baking, and sodium sulfate remains as an ionic impurity in the coating after baking. Therefore, it is not suitable for applications to electronic materials such as printed boards.

DISCLOSURE OF THE INVENTION

Problems that the Invention is to Solve

An object of the present invention is to provide an aqueous PTFE dispersion having excellent properties which can form crack-resistant coatings which do not undergo coloration during baking or form problematic ionic impurities by improving the friction stability of aqueous PTFE dispersions even at APFO concentrations without viscosity increase. Another object of the present invention is to provide a process for producing a high concentration PTFE aqueous dispersion which enables production of a high concentration PTFE aqueous dispersion having a high PTFE concentration from a low concentration PTFE aqueous dispersion having a low APFO concentration.

Means of Solving the Problems

The present inventors conducted extensive research to solve the above-mentioned problems and, as a result, have found that addition of a specific fluorine-containing carboxylic acid salt improves friction stability of aqueous PTFE dispersions even at low APFO concentrations without viscosity increase, and prevents cracking of coatings, coloration of coatings during baking and formation of problematic ionic impurities. They have also found that a high concentration PTFE aqueous dispersion can be obtained by adding a specific fluorine-containing carboxylic acid to a low concentration PTFE aqueous dispersion and concentrating it, or even from a low concentration PTFE aqueous dispersion having a low APFO concentration by adding a specific fluorine-containing carboxylic acid and concentrating the dispersion. The present invention has been accomplished on the basis of the discovery.

Namely, the present invention provides an aqueous dispersion of PTFE comprising from 55 to 70 mass % of PTFE fine particles having an average particle diameter of from 0.1 to 0.5 μm, from 0.0001 to 0.02 mass %, based on PTFE, of a fluorine-containing carboxylic acid salt represented by the formula (1), from 1 to 20 mass %, based on PTFE, of a nonionic surfactant represented by the formula (2) and/or the formula (3), and from 0.01 to 0.3 mass %, based on PTFE, of a fluorine-containing carboxylic acid salt represented by the formula (4):

formula (1): $R^1$—COOX (wherein $R^1$ is a $C_7$ alkyl group having fluorine atoms instead of from 90 to 100% of the hydrogen atoms (which may contain from 1 to 2 ether oxygen atoms), and X is an ammonium ion);

formula (2): $R^2$—O-A-H (wherein $R^2$ is a $C_{8-18}$ alkyl group, and A is a polyoxyalkylene chain consisting of from 5 to 20 oxyethylene groups and from 0 to 2 oxypropylene groups);

formula (3): $R^3$—$C_6H_4$—O—B—H (wherein $R^3$ is a $C_{4-12}$ alkyl group, and B is a polyoxyalkylene chain consisting of from 5 to 20 oxyethylene groups); and formula (4): $R^4$—COOY (wherein $R^4$ is a $C_{4-6}$ alkyl group having fluorine atoms instead of from 30 to 100% of the hydrogen atoms (which may contain from 1 to 2 ether oxygen atoms), and Y is a cationic group represented by the formula $\{HO(CH_2)_n\}_z N^+ H_{4-z}$ wherein n is an integer of from 2 to 4, and z is an integer of from 0 to 4).

The present invention also provides a process for producing an aqueous dispersion of PTFE, which comprises mixing a low concentration aqueous dispersion of PTFE comprising from 1 to 40 mass % of PTFE fine particles having an average particle diameter of from 0.1 to 0.5 μm, from 0.0001 to 0.02 mass %, based on PTFE, of a fluorine-containing carboxylic acid represented by the formula (1), from 1 to 20 mass %, based on PTFE, of a nonionic surfactant represented by the formula (2) and/or the formula (3), with from 0.01 to 0.3 mass %, based on PTFE, of a fluorine-containing carboxylic acid salt represented by the formula (4), and concentrating the low concentration aqueous dispersion of PTFE to give a high concentration aqueous dispersion of PTFE containing PTFE at a concentration of from 60 to 75 mass %.

EFFECTS OF THE INVENTION

The aqueous dispersion of PTFE of the present invention can prevent viscosity increase and has good friction stability. Baked products of the aqueous dispersion of PTFE can prevent cracking of coatings and are free from problems such as coloration and ionic impurities. The process for producing an aqueous dispersion of PTFE of the present invention can easily produce a high concentration aqueous dispersion of PTFE through a step for producing an aqueous dispersion of PTFE having a lowered APFO concentration.

BEST MODE FOR CARRYING OUT THE INVENTION

In the aqueous dispersion of PTFE of the present invention, PTFE fine particles having an average particle diameter of from 0.10 to 0.50 μm, preferably from 0.15 to 0.40 μm, particularly preferably from 0.20 to 0.35 μm, obtained by emulsion polymerization are used. If the average particle diameter is smaller than 0.10 μm, the PTFE has a low molecular weight and mechanically weak, and PTFE fine particles having an average particle diameter larger than 0.50 μm are not preferable because they sediment so fast that the storage stability deteriorates.

The number average molecular weight of PTFE is preferably from 500,000 to 30,000,000, particularly preferably from 1,000,000 to 25,000,000, though it can be selected arbitrary. If the number average molecular weight is smaller than 500,000, the PTFE is mechanically weak, and PTFE having a number average molecular weight larger than 30,000,000 is difficult to produce industrially.

The number average molecular weight is calculated from the heat of crystallization by the method of Suwa et al. (Journal of Applied Polymer Science, 17, 3253 (1973)).

In the present invention, PTFE includes not only a homopolymer of TFE, but also so-called modified PTFE containing polymerized units derived from a comonomer component copolymerizable with TFE, for example, a halogenated ethylene such as chlorotrifluoroethylene, a halogenated propylene such as hexafluoropropylene or a fluorovinyl ether such as a perfluoro(alkyl vinyl ether), in such a small amount that melt-processing is substantially impossible.

The PTFE fine particles are preferably obtained as an aqueous PTFE polymer emulsion by polymerizing the TFE monomer injected under a pressure of from 2 to 50 atm, in the presence of pure water, a peroxide type polymerization initiator, APFO and a paraffin wax stabilizer. The PTFE concentration in the aqueous PTFE polymer emulsion is from 1 to 40 mass %, preferably from 10 to 40 mass %, more preferably from 15 to 35 mass %, particularly preferably from 20 to 30 mass %. If the PTFE concentration is lower than 1 mass %, concentration takes time and energy, and if the PTFE concentration is higher than 40 mass %, the product yield can be low due to agglomeration of PTFE fine particles.

The APFO to be used in the present invention is represented by the formula (1).

Formula (1): $R^1$—COOX (wherein $R^1$ is a $C_7$ alkyl group having fluorine atoms instead of from 90 to 100% of the hydrogen atoms (which may contain from 1 to 2 ether oxygen atoms), and X is an ammonium ion)

Specific examples of the APFO of the formula (1) include $C_7F_{15}COONH_4$, $HC_7F_{14}COONH_4$, $C_4F_9OC_2F_4OCF_2COONH_4$, $HC_4F_8OC_2F_4OCF_2COONH_4$ and the like. The APFO is preferably an ammonium perfluorocarboxylate, and $C_7F_{15}COONH_4$ is preferred most because it stabilizes the process. APFOs of the formula (1) may be used singly or in combination of two or more.

The APFO of the formula (1) is used in an amount of from 0.05 to 1.0 mass %, preferably from 0.1 to 0.5 mass %, particularly preferably from 0.15 to 0.3 mass %, based on PTFE, when the TFE monomer is polymerized. If the APFO of the formula (1) is used in an amount of less than 0.05 mass % in the polymerization, the product yield is low due to agglomeration of PTFE fine particles, and if the amount is larger than 1.0 mass %, PTFE is hardly obtained in the form of fine particles.

The nonionic surfactant to be used in the present invention is represented by the formula (2) and/or the formula (3).

Formula (2): $R^2$—O-A-H (wherein $R^2$ is a $C_{8-18}$ alkyl group, and A is a polyoxyalkylene chain consisting of from 5 to 20 oxyethylene groups and from 0 to 2 oxypropylene groups)

Formula (3): $R^3$—$C_6H_4$—O—B—H (wherein $R^3$ is a $C_{4-12}$ alkyl group, and B is a polyoxyalkylene chain consisting of from 5 to 20 oxyethylene groups)

In the formula (2), the alkyl group as $R^2$ has a carbon number of from 8 to 18, preferably from 10 to 16, particularly preferably from 12 to 16. If the carbon number is larger than 18, the surfactant has a high pour point and is difficult to handle, and the PTFE aqueous dispersion tends to have poor storage stability because the PTFE fine particles readily sediment when the PTFE aqueous dispersion is left to stand for a long time. If the carbon number is smaller than 8, the PTFE aqueous dispersion has a high surface tension and has poor wettability when applied to form a coating.

In the formula (2), the hydrophilic group A is a polyoxyalkylene chain consisting of from 5 to 20 oxyethylene groups and from 0 to 2 oxypropylene groups, preferably consisting of from 7 to 12 oxyethylene groups and from 0 to 2 oxypropylene groups, in view of viscosity and stability. Especially, it is preferred that the hydrophilic group A has from 0.5 to 1.5 oxypropylene groups because the defoaming property is good.

In the formula (3), the alkyl group as $R^3$ has a carbon number of from 4 to 12, preferably from 6 to 10, particularly preferably from 8 to 9. If the alkyl group has a carbon number smaller than 4, the PTFE aqueous dispersion has a high surface tension and has poor wettability, and if the carbon number is larger than 12, the PTFE aqueous dispersion tends to have poor storage stability because the PTFE fine particles readily sediment when the PTFE aqueous dispersion is left to stand for a long time.

In the formula (3), the hydrophilic group B is a polyoxyalkylene chain consisting of from 5 to 20 oxyethylene groups, preferably consisting of from 6 to 16 oxyethylene groups, particularly preferably from 7 to 12 oxyethylene groups, in view of viscosity and stability.

The nonionic surfactant of the formula (2) or the formula (3) preferably has an average molecular weight of from 450 to 800, more preferably from 500 to 750, particularly preferably from 550 to 750. A surfactant having an average molecular weight larger than 800 is not preferable because it would have a high pour point and would be difficult to handle. A surfactant having an average molecular weight smaller than 450 is not preferable either, because the PTFE aqueous dispersion would have poor wettability when applied to form a coating.

Specific examples of the nonionic surfactant of the formula (2) include nonionic surfactants having molecular structures such as $C_{13}H_{27}$—$(OC_2H_4)_{10}$—OH, $C_{12}H_{25}$—$(OC_2H_4)_{10}$—OH, $C_{10}H_{21}CH(CH_3)CH_2$—$(OC_2H_4)_9$—OH, $C_{13}H_{27}$—$(OC_2H_4)_9$—$OCH(CH_3)CH_2$—OH, $C_{16}H_{33}$—$(OC_2H_4)_{10}$—OH and $HC(C_5H_{11})(C_7H_{15})$—$(OC_2H_4)_9$—OH and commercial products such as the TERGITOL (registered trademark) 15 series manufactured by Dow and the LIONOL (registered trademark) TD series manufactured by Lion.

Specific examples of the nonionic surfactant of the formula (3) include nonionic surfactants having molecular structures such as $C_8H_{17}$—$C_6H_4$—$(OC_2H_4)_{10}$—CH and $C_9H_{19}$—$C_6H_4$—$(OC_2H_4)_{10}$—OH and commercial products such as the Triton (registered trademark) X series manufactured by Dow and the NIKKOL (registered trademark) OP and NP series manufactured by Nikko Chemicals.

Nonionic surfactants of the formula (2) and/or the formula (3) may be used singly or in combination of two or more.

Since a nonionic surfactant is a mixture of at least two substances having different molecular structures, the carbon number of the alkyl groups and the numbers of the oxyethylene groups and oxypropylene groups in the polyoxyalkylene chain in a nonionic surfactant are averaged out herein and, therefore, may not be integers.

In the present invention, the nonionic surfactant of the formula (2) and/or the formula (3) is added to an aqueous PTFE polymer emulsion to secure stability during the process and added to a high concentration aqueous dispersion of PTFE after concentration to adjust the physical properties and attain the viscosity and wettability suitable for the intended use.

The low concentration aqueous dispersion of PTFE to be used in the present invention is obtainable by stabilizing an aqueous PTFE polymer emulsion with a nonionic surfactant and reducing the APFO concentration to 0.0001 to 0.02 mass % by known methods disclosed in WO03/078479, WO00/35971, JP-A-55-120631 and the like.

The APFO concentration in the low concentration aqueous dispersion of PTFE is preferably from 0.0001 to 0.02 mass %, based on PTFE. It is industrially difficult to attain an APFO concentration lower than 0.0001 mass %, and an APFO concentration higher than 0.02 mass % is unfavorable in view of environmental influences.

The fluorine-containing carboxylic acid to be used in the present invention is as follows.

Formula (4): $R^4$—COOY (wherein $R^4$ is a $C_{4-6}$ alkyl group having fluorine atoms instead of from 30 to 100% of the hydrogen atoms (which may contain from 1 to 2 ether oxygen atoms), and Y is a cationic group represented by the formula $\{HO(CH_2)_n\}_z N^+H_{4-z}$ wherein n is an integer of from 2 to 4, and z is an integer of from 0 to 4)

In the formula (4), the alkyl group as $R^4$ may be linear or branched, and may be primary, secondary or tertiary. The alkyl group has a carbon number of from 4 to 6, preferably from 4 to 5, particularly preferably S. If the carbon number is smaller than 4, the effect of improving the friction stability of the aqueous dispersion of PTFE, the effect of preventing viscosity increase and the effect of preventing cracking of coatings are little. If the carbon number is larger than 6, the surfactant is hardly discharged from the body once taken up by a living organism, and can have environmental influences.

For example, while the biological accumulativity of ammonium perfluorooctanoate with $R^4$ having a carbon number of 7 is seen as a problem, ammonium perfluorohexanoate with $R^4$ having a carbon number of 5 is hardly bioaccumulative.

In the alkyl group as $R^4$ in the formula (4), from 30% to 100% of the hydrogen atoms bonded to carbon atoms have been replaced. It is not preferred that less than 30% of them have been replaced by fluorine atoms, because the effect of improving the friction stability of the aqueous dispersion of PTFE, the effect of preventing viscosity increase and the effect of preventing cracking of coatings would be little.

As a Specific example of Y, a cation selected from an ammonium ion, an ethanolamine ion, a diethanolamine ion and a triethanolamine ion is preferred, and an ammonium ion is particularly preferred because it is removed easily by evaporating upon drying.

The fluorine-containing carboxylic acid salt of the formula (4) is obtainable by various methods, for example, by electrolytically fluorinating the corresponding carboxylic acid chloride, hydrolyzing the fluorination product, neutralizing the resulting fluorine-containing carboxylic acid with an equivalent or excess amount of aqueous ammonia, ethanolamine, diethanolamine and/or triethanolamine and, if necessary, concentrating and drying the neutralization product. The replacement by fluorine atoms can be made to an arbitrary degree by changing the degree of the electrolytic fluorination.

Specific examples of the fluorine-containing carboxylic acid salt of the formula (4) include $C_4F_9COONH_4$, $C_5F_{11}COONH_4$, $HC_5F_{10}COONH_4$, $(CF_3)_2CF(CH_2)_2COONH_3(C_2H_4OH)$, $C_5F_{11}COONH_3C_2H_4OH$, $HC_5F_{10}COONH(C_2H_4OH)_3$, $C_6F_{13}COONH_4$, $C_4F_9OCF_2COONH_4$, $C_2F_5OC_2F_4OCF_2COONH_4$ and the like.

An aqueous dispersion of PTFE having a low APFO concentration drastically increases in viscosity especially when a nonionic surfactant is added in such a large amount as from 6 to 12 mass % based on PTFE and becomes unsuitable for coating. However, addition of the fluorine-containing carboxylic acid represented by the formula (4) prevents the viscosity increase.

Since the fluorine-containing carboxylic acid salt of the formula (4) is thermally decomposable, it does not cause coloration of coatings of the aqueous dispersion of PTFE during baking at around 380° C. and does not form ionic impurities, and, thereby, improves the quality of products.

Though an aqueous dispersion of PTFE having a low APFO concentration has poor friction stability, addition of the fluorine-containing carboxylic acid salt of the formula (4) improves the friction stability of an aqueous dispersion of PTFE, prevents clogging of a pump by suppressing agglomeration of an aqueous dispersion of PTFE during pumping and agglomeration in frictionized areas during coating. The reason why friction stability improves is supposed to be that PTFE fine particles carry more anionic charges as they adsorb the fluorine-containing carboxylic acid salt of the formula (4) and are kept out of contact with one another.

Though thick coatings of an aqueous dispersion of PTFE are vulnerable to cracking, addition of the fluorine-containing carboxylic acid salt of the formula (4) make them resistant to cracking.

The fluorine-containing carboxylic acid salt of the formula (4) may be added after or before concentration of a low concentration aqueous solution of PTFE, or both before and after the concentration.

At low APFO concentrations, it is difficult to concentrate a low concentration aqueous dispersion of PTFE to a high PTFE fine particle concentration. Especially, at APFO concentrations less than 200 ppm/PTFE, the concentration rate is extremely low, and there is a problem that a high concentration aqueous dispersion of PTFE having a high PTFE concentration cannot be obtained after the concentration. It is preferred to add the fluorine-containing carboxylic acid salt of the formula (4) before the concentration because it increases the concentration rate during the concentration.

If the fluorine-containing carboxylic acid salt of the formula (4) is added before the concentration, it is preferably added after removal of APFO from a low concentration aqueous dispersion of PTFE, though it may be added before the removal of APFO. The fluorine-containing carboxylic acid salt of the formula (4) may be added batchwise or continuously, if necessary, by using an in-line mixer or static mixer.

When the fluorine-containing carboxylic acid salt of the formula (4) is added before the concentration, it is added in an amount of from 0.01 to 0.3 mass %, preferably from 0.02 to 0.25 mass %, particularly preferably from 0.02 to 0.20 mass %. When the amount is less than 0.01 mass %, the concentration rate does not increase sufficiently, and a high concentration aqueous dispersion of PTFE having a high PTFE concentration is hardly obtained.

In the process for producing an aqueous dispersion of PTFE, addition of the fluorine-containing carboxylic acid salt of the formula (4) is followed by concentration of the low concentration aqueous dispersion of PTFE. Various concentration processes are available for the concentration. For example, centrifugal sedimentation, electrophoresis, phase separation and other known methods are available, as disclosed in Handbook of Fluorine resins, p. 32 (edited by Takaomi Satokawa, published by Nikkankogyo Shimbun). At the time of the concentration, the pH of the aqueous dispersion of PTFE is preferably at least 6, more preferably from 7 to 12, particularly preferably from 7 to 10.

During the concentration, part of APFO is removed with the supernatant. It is advantageous to add the fluorine-containing carboxylic acid salt of the formula (4) before the concentration, because more of APFO transfers to the supernatant and is removed with the supernatant. Though part of the fluorine-containing carboxylic acid salt of the formula (4) added before the concentration is removed with the supernatant during the concentration, most of it is adsorbed by PTFE fine particles and remains in the high concentration aqueous dispersion of PTFE obtained as the sediment layer.

The high concentration aqueous dispersion of PTFE obtained after the concentration has a PTFE concentration of from 60 to 75 mass %, preferably from 63 to 72 mass %, particularly preferably from 65 to 70 mass %. If the PTFE concentration is higher than 75 mass %, the PTFE fine particles tend to agglomerate in parts, and the product yield is low. If the PTFE concentration is lower than 60 mass %, the aqueous dispersion of PTFE has too a low viscosity to be coated, and the storage stability is problematically poor.

The aqueous dispersion of PTFE of the present invention may be the resulting high concentration aqueous dispersion of PTFE itself, or may be obtained by diluting the high concentration aqueous dispersion of PTFE with water or by adding additional nonionic surfactants and anionic surfactants, various other known ingredients such as leveling agents, antiseptic agents, coloring agents, fillers and organic solvents, for improvement of stability and optimization of viscosity and wettability, as the case requires. Especially, use of a viscosity modifier of polyethylene oxide or polyurethane type is preferable because the friction stability improves further. As the viscosity modifier, those disclosed in JP-A-2000-198899 are preferred. A viscosity modifier is usually added in an amount of from 0.01 to 1 mass %, preferably from 0.1 to 0.5 mass %, based on PTFE.

Thus, the aqueous dispersion of PTFE of the present invention is obtained from the high concentration aqueous dispersion of PTFE.

The aqueous dispersion of PTFE of the present invention has a PTFE concentration of from 55 to 70 mass %, preferably from 58 to 68 mass %, particularly preferably from 60 to 65 mass %. If the PTFE concentration is higher than 70 mass %, the viscosity is too high, and if the PTFE concentration is lower than 55 mass %, the PTFE fine particles tend to sediment, and the storage stability is poor.

The aqueous dispersion of PTFE of the present invention contains the nonionic surfactant represented by the formula (2) and/or the formula (3) at a concentration of from 1 to 20 mass %, preferably from 2.0 to 12.0 mass %, particularly preferably from 3.0 to 10.0 mass %, based on PTFE. When the nonionic surfactant is added for the purpose of impart storage stability or mechanical stability to the aqueous dispersion of PTFE, the concentration of the nonionic surfactant is preferred to be from 2.0 to 8.0 mass %, particularly from 3.0 to 7.0 mass %. If the concentration of the nonionic surfactant is lower than 10 mass %, the storage stability can be poor, and PTFE fine particles can agglomerate. It is not economical that the concentration is higher than 20 mass %. Especially, for improvement of coating wettability and formation of crack-resistant thick coatings, it is preferred to add the nonionic surfactant in such a large amount as from 6.0 to 12.0 mass %, particularly from 8.0 to 12.0 mass %. Cracking tends to occur if the amount is smaller than 6.0 mass % or higher than 12.0 mass %.

The concentration of the fluorine-containing carboxylic acid salt of the formula (4) in the aqueous dispersion of PTFE of the present invention is from 0.01 to 0.3 mass %, preferably from 0.02 to 0.25 mass %, particularly preferably from 0.02 to 0.25 mass %, based on PTFE. If the concentration of the fluorine-containing carboxylic acid salt is lower than 0.01 mass %, improvement in concentration efficiency and friction stability and prevention of viscosity increase and cracks in coatings are not attained, and if the concentration is higher than 0.3 mass %, the aqueous dispersion of PTFE is too viscous to form coatings with controlled thicknesses.

The APFO concentration in the aqueous dispersion of PTFE of the present invention is from 0.0001 to 0.02 mass %, preferably from 0.001 to 0.01 mass %, particularly preferably from 0.002 to 0.005 mass %, based on PTFE. It is industrially difficult to attain an APFO concentration lower than 0.0001 mass %, and it is not preferable that the APFO concentration is higher than 0.02 mass %, in view of environmental influences.

The pH of the aqueous dispersion of PTFE of the present invention is from 7 to 12, preferably from 8 to 11, particularly preferably from 8.5 to 10.5. For pH adjustment, it is preferred to dissolve a sufficient amount of an alkaline substance such as ammonia which can be removed upon baking. At a pH lower than 7, the fluorine-containing carboxylic acid salt of the formula (4) can be instable and precipitate. It is not preferred that the pH is higher than 12, because the smell of ammonia or the like is strong, and the dispersion has much influence on the human body when it touches the skin.

The aqueous dispersion of PTFE of the present invention has good friction stability, is unlikely to form agglomerates which clog pumps during pumping, and is unlikely to agglomerate in frictionized areas during coating.

EXAMPLES

Now, the present invention will be described in further detail with reference to Examples and Comparative Examples, but these will by no means restrict the present invention. Examples 1 to 5 are Working Examples, and Examples 6 to 10 are Comparative Examples.

An evaluation method for each item will be shown below.

(A) the average molecular weight of PTFE: it was obtained from a latent heat measured by differential calorimetry in accordance with the method by Suwa et al. (described in J. Appl. Polym. Sci, 17, 3253 (1973)).

(B) the average particle diameter of PTFE: After drying, an aqueous PTFE dispersion was photographed at a magnification of 10000 by using a scanning electron microscope, and the average value was obtained.

(C) PTFE concentration and surfactant concentrations: Approximately 10 g of a dispersion sample was put in an aluminum plate of a known mass and weighed after an hour of dehydration at 120° C. and after 35 minutes of thermal decomposition of the surfactant at 380° C., and the PTFE concentration and the surfactant concentrations based on PTFE were calculated. In the present invention, the surfactant concentration was calculated by including APFO, a fluorine-containing carboxylic acid salt and other thermal decomposition products.

(D) APFO concentration and fluorine-containing carboxylic acid salt concentration: APFO aqueous solutions and aqueous solutions of fluorine-containing carboxylic acid salts having known concentrations were analyzed by LCMS (high performance liquid chromatography-mass spectrometry), and peak areas were plotted to make calibration curves. Then, 50 g of a low or high concentration aqueous dispersion of PTFE was dried at 70° C. for 16 hours, and APFO and the fluorine-containing carboxylic acid salt were extracted with ethanol, and from the LCMS peak area of the extract, the APFO concentration and the fluorine-containing carboxylic acid salt concentration in the sample were determined by using the calibration curves.

(E) pH: It was measured by the glass electrode method.

(F) viscosity: measurements were done by using a Brookfield viscometer equipped with a spindle No. 1 at 60 rpm. Viscosities of 40 mPa·s or below were rated good, and viscosities exceeding 40 mPa·s were rated bad.

(G) critical cracking thickness: 2 cc of an aqueous dispersion of PTFE was spread onto a 10 cm×10 cm clean flat aluminum plate having a 0.5 mm thickness with a coating applicator having a coater gap having gap widths of 0 μm at one end and 200 μm at the other end to form a coating having a thickness continuously varying from 0 to 200 μm, and the coating was dried at 120° C. for 1 hour and baked at 380° C. for 35 minutes. Cracks were observed in thick portions of the coating and faded away as the thickness decreased. The critical cracking thickness was determined by measuring the thicknesses of the coating at five points disappeared with a permascope and averaging them. A critical cracking thickness of 20 μm or above was rated good, and a critical cracking thickness less than 20 μm was rated bad.

(H) Friction stability: A TYGON tube having an outer diameter of 7.9 mm and an inner diameter of 4.8 mm was put through a tubular pump manufactured by Cole-Palmer with both ends of the tube in a 200 cc beaker filled with 100 cc of an aqueous dispersion of PTFE. The beaker was covered with aluminum foil to prevent evaporation of the dispersion. The resulting apparatus was used to circulate the aqueous dispersion of PTFE at 23° C. at a feed rate of 200 cc/min for 2 hours, and after the circulation, the dispersion was filtered through a 200-mesh nylon filter to collect agglomerates. The agglomerates were dried at 120° C. for 1 hour and then weighed. When the amount of agglomerates was 2 g or below, the friction stability was judged good, and when it was above 2 g, the friction stability was judged poor.

(I) Coating test and colorimetry: A glass fiber cloth weighing 80 g per 1 m² was cut into 10 cm×5 cm and baked at 400° C. for 1 hour and dipped in an aqueous dispersion of PTFE in a beaker and withdrawn to form a coating. It was dried at 120° C. for 10 minutes and baked at 380° C. The cloth was further coated with the aqueous dispersion of PTFE, dried and baked repeatedly 6 times to make a PTFE-coated glass fiber cloth. The hues L*, a* and b* were measured with an SM color computer manufactured by Suga Test Instruments, and ΔL*, Δa* and Δb* were calculated by subtracting the hues L0*, a0* and b0* of the glass fiber cloth before coating. When the indicator of yellowing, Δb*, was less than 3, the dispersion was rated good, and when it was 3 or more, the dispersion was rated bad. When cracks were observed over the whole surface of the coating under a microscope, the dispersion was rated bad.

(J) Electric conductivity: The PTFE-coated glass fiber cloth used for colorimetry was immersed in 10 times by mass as much distilled water for 1 hour, and the electric conductivity of the water was measured with a conductivity meter manufactured by Lacom. A conductivity of less than 1 μS indicates little dissolution of ionic components and was judged good, and a conductivity above 1 μS was judged bad.

The additives (a) to (k) used in the Examples are those marked with the corresponding symbols in Table 1 and Table 2. The chemical structures of the additives are shown in Table 3.

Example 1

Emulsion polymerization was carried out in the presence of ammonium perfluorooctanoate as APFO preliminary added in an amount of 0.25 mass % based on the resulting PTFE to obtain an aqueous PTFE polymer emulsion having a PTFE concentration of 29 mass %, an average particle diameter of 0.25 μm and an average molecular weight of about 3,000,000.

The nonionic surfactant (a) was added in an amount of 5 mass % based on PTFE to the aqueous PTFE polymer emulsion, and the emulsion was stirred with 2 mass %, based on PTFE, of a weak basic anion exchange resin, DIAION (registered trademark) WA-30 manufactured by Mitsubishi Chemical, for 24 hours. Then, the anion exchange resin was removed by filtration through a 200-mesh nylon filter to obtain a low concentration aqueous dispersion of PTFE having a APFO concentration lowered to 0.0065 mass % based on PTFE.

Then, 0.3 mass %, based on PTFE, of 10 mass % aqueous solution of ammonium perfluorohexanoate (containing 32.4 g of perfluorohexanoic acid manufactured by Azmax, 286.6 g of pure water and 12 g of 28 mass % aqueous ammonia) (which corresponds to 0.03 mass %, based on PTFE, of ammonium perfluorohexanoate), as the fluorine-containing carboxylic acid salt (d), was added, and the dispersion was electrophoretically concentrated over 30 hours to obtain a high concentration aqueous dispersion having a PTFE concentration of about 67.2 mass % and a surfactant concentration of 2.3 mass % based on PTFE.

To the high concentration aqueous dispersion of PTFE, 7.2 mass %, based on PTFE, of the nonionic surfactant (a), 0.2 mass %, based on PTFE, of polyethylene oxide (j) (molecular weight 500,000, manufactured by Wako Pure Chemical Industries, and 0.05 mass %, based on PTFE, of 28 mass % aqueous ammonia were added to give an aqueous dispersion of PTFE having a PTFE concentration of about 55.9 mass %, a surfactant concentration of 9.5 mass % based on PTFE and an APFO concentration of 0.0046 mass % based on PTFE.

The viscosity, critical cracking thickness and friction stability of the aqueous dispersion of PTFE were good, and the results of the coating test on a glass fiber cloth and the extraction test were good with little coloration and little dissolution of impurities.

Example 2

The procedure in Example 1 was followed except that 0.08 mass %, based on PTFE, of the fluorine-containing carboxylic acid salt (d) was added to the high concentration aqueous dispersion of PTFE obtained in Example 1 to give an aqueous dispersion of PTFE having better critical cracking thickness and friction stability.

Example 3

The procedure in Example 1 was followed except that the nonionic surfactant (b) was used in stead of the nonionic surfactant (a), and the fluorine-containing carboxylic acid salt (d) was used in an amount of 0.10 mass % based on PTFE to obtain an aqueous dispersion of PTFE.

Example 4

The procedure in Example 1 was followed except that the nonionic surfactant (c) was used in stead of the nonionic surfactant (a), and 0.02 mass %, based on PTFE, of the fluorine-containing carboxylic acid salt (e) was used to give an aqueous dispersion of PTFE. As the fluorine-containing carboxylic acid salt (e), 10 mass % aqueous solution containing 24.2 g of 4,5,5,5,tetrafluoro-4-(trifluoromethyl)pentanoic acid (in which 63% of the hydrogen atoms had been replaced by fluorine atoms), 272.7 g of pure water and 6.1 g of ethanolamine was used.

Example 5

To the aqueous PTFE polymer emulsion used in Example 1, 15 mass %, based on PTFE, of the nonionic surfactant (a) was added, and the emulsion was stirred with 2 mass %, based on PTFE, of DIAION (registered trademark) WA-30 manufactured by Mitsubishi Chemical, for 24 hours to obtain a low concentration aqueous dispersion of PTFE having an APFO concentration of 0.0064 mass % based on PTFE. After addition of 0.05 mass %, based on PTFE, of the fluorine-containing carboxylic acid salt (f), the dispersion was left to stand in a 10 liters vessel at 80° C. for 24 hours and concentrated by phase separation to obtain a high concentration aqueous dispersion of PTFE having a PTFE concentration of about 67.1 mass % and a surfactant concentration of 3.0 mass % based on PTFE.

To the high concentration aqueous dispersion of PTFE, 6.5 mass %, based on PTFE, of the nonionic surfactant (a), 0.05 mass %, based on PTFE, of the fluorine-containing carboxylic acid salt (f), 0.2 mass %, based on PTFE, of polyethylene oxide (j) and 0.05 mass %, based on PTFE, of 28 mass % aqueous ammonia to obtained an aqueous dispersion of PTFE.

Example 6

The procedure in Example 1 was followed except that the fluorine-containing carboxylic acid salt (d) was not used. The resulting high concentration aqueous dispersion of PTFE had a PTFE concentration as low as 58.5 mass %. The aqueous dispersion of PTFE obtained after blending had a high viscosity, a small critical cracking thickness and poor friction stability and, therefore was unfavorable.

Example 7

The procedure in Example 1 was followed except that the fluorine-containing carboxylic acid salt (g) (Sodium Heptafluorobutylate, manufactured by AZmax) was added in an amount of 0.05 mass % based on PTFE to obtain a high concentration aqueous dispersion of PTFE. The resulting high concentration aqueous dispersion of PTFE has a PTFE concentration as low as 61.8 mass %. The aqueous dispersion of PTFE obtained after blending had a high viscosity, a small critical cracking thickness and poor friction stability and, therefore was unfavorable. The dispersion was unfavorable also because the electric conductivity of the immersion water was high, and dissolution of ionic impurities was acknowledged.

Example 8

The procedure in Example 1 was followed except that the fluorine-free carboxylic acid salt (h) (n-hexanoic acid neutralized with ammonia manufactured by Wako Pure Chemical Industries) was added in an amount of 0.10 mass % based on PTFE to obtain a high concentration aqueous dispersion. The high concentration aqueous dispersion of PTFE had a PTFE concentration as low as 62.2 mass %, and the aqueous dispersion of PTFE obtained after blending had a high viscosity, a small critical cracking thickness and poor friction stability, and, therefore, was unfavorable.

Example 9

The procedure in Example 1 was followed except that the fluorine-free and sulfur-containing anionic surfactant (i) (sodium lauryl sulfate, manufactured by Wako Pure Chemical Industries) was added in an amount of 0.10 mass % based on PTFE to obtain an aqueous dispersion of PTFE. A coating test was carried out with this aqueous dispersion of PTFE, and the resulting coated-cloth sample was colored brown. The electric conductivity of the immersion water was large and thus unfavorable.

Example 10

The procedure in Example 5 was followed except that the fluorine-containing carboxylic acid salt (d) was added in an amount of 0.50 mass % based on PTFE to obtain an aqueous dispersion of PTFE. The resulting aqueous dispersion of PTFE was unfavorable because it had a high viscosity, the PTFE pickup during a coating test was large, and cracking occurred.

TABLE 1

| Item | | Example 1 | Example 2 | Example 3 | Example 4 | Example 5 |
|---|---|---|---|---|---|---|
| Aqueous PTFE polymer emulsion | PTFE concentration (mass %) | 29 | 29 | 29 | 29 | 29 |
| | APFO concentration (mass %/PTFE) | 0.25 | 0.25 | 0.25 | 0.25 | 0.25 |
| Nonionic surfactant added to aqueous PTFE polymer emulsion and the amount thereof (mass %/PTFE) | | (a) 5 | (a) 5 | (b) 5 | (c) 5 | (a) 15 |
| Removal of APFO and APFO concentration after the removal | Method | Ion exchange | Ion exchange | Ion exchange | Ion exchange | Ion exchange |
| | APFO concentration (mass %/PTFE) | 0.0065 | 0.0065 | 0.0063 | 0.0067 | 0.0064 |
| Fluorine-containing carboxylic acid and the amount thereof (mass %/PTFE) | | (d) 0.03 | (d) 0.03 | (d) 0.10 | (e) 0.20 | (f) 0.05 |
| Concentration procedure and the concentration of the resulting high concentration aqueous dispersion of PTFE | Method | Electrophoresis | Electrophoresis | Electrophoresis | Electrophoresis | Phase separation |
| | PTFE concentration (mass %) | 67.2 | 67.2 | 67.1 | 67.3 | 67.1 |
| | Surfactant concentration (mass %/PTFE) | 2.3 | 2.3 | 2.2 | 2.3 | 3.0 |
| | pH | 8.5 | 8.5 | 8.7 | 9.1 | 8.9 |
| Additive added after concentration | Nonionic surfactants and the amounts thereof (mass %/PTFE) | (a) 7.2 | (a) 7.2 | (b) 7.2 | (c) 7.2 | (a) 6.5 |
| | Fluorine-containing carboxylic acid and the amount thereof (mass %/PTFE) | Nil | (d) 0.07 | Nil | Nil | (f) 0.05 |
| | Other additives and the amounts thereof (mass %/PTFE) | (j) 0.02 (k) 0.05 | (j) 0.02 (k) 0.05 | (j) 0.02 (k) 0.05 | (j) 0.02 (k) 0.05 | (j) 0.02 (k) 0.05 |
| Properties of aqueous dispersion of PTFE after blending | PTFE concentration (mass %) | 55.9 | 55.8 | 55.8 | 55.9 | 55.3 |
| | Surfactant concentration (mass %/PTFE) | 9.5 | 9.5 | 9.5 | 9.5 | 9.5 |
| | APFO concentration (mass %/PTFE) | 0.0046 | 0.0046 | 0.0043 | 0.0038 | 0.0029 |
| | Fluorine-containing carboxylic acid and the detected concentration thereof (mass %/PTFE) | (d) 0.026 | (d) 0.106 | (d) 0.078 | (e) 0.142 | (d) 0.084 |
| | Viscosity at 23° C. (mPa·s) | 24 | 23 | 24 | 23 | 22 |
| | pH | 9.3 | 9.5 | 9.5 | 9.5 | 9.5 |
| | Critical cracking thickness (μm) | 21.5 | 26.2 | 24.5 | 26.3 | 25.5 |
| | Agglomerates generated upon friction stability test (g) | 1.72 | 0.86 | 0.41 | 0.80 | 0.75 |
| Coating test on glass fiber cloth | Color | White | White | White | White | White |
| | Appearance | Good | Good | Good | Good | Good |
| | ΔL* | −2.11 | −2.34 | −4.06 | −2.31 | −1.98 |
| | Δa* | 0.09 | 0.10 | 0.51 | 0.07 | 0.12 |
| | Δb* | 0.43 | 0.21 | 2.34 | 0.37 | 0.64 |
| Electrical conductivity after elution test (μS) | | <1 | <1 | <1 | <1 | <1 |
| Evaluation | | Good | Good | Good | Good | Good |

TABLE 2

| | Item | Example 6 | Example 7 | Example 8 | Example 9 | Example 10 |
|---|---|---|---|---|---|---|
| Aqueous PTFE polymer emulsion | PTFE concentration (mass %) | 29 | 29 | 29 | 29 | 29 |
| | APFO concentration (ppm/PTFE) | 2500 | 2500 | 2500 | 2500 | 2500 |
| Nonionic surfactant added to aqueous PTFE polymer emulsion and the amount thereof (mass %/PTFE) | | (a) 5 | (a) 5 | (b) 5 | (c) 5 | (a) 15 |
| Removal of APFO and APFO concentration after the removal | Method | Ion exchange | Ion exchange | Ion exchange | Ion exchange | Ion exchange |
| | APFO concentration (mass %/PTFE) | 0.0066 | 0.0066 | 0.0066 | 0.0066 | 0.0064 |
| Additives added before concentration and the amount thereof (mass %/PTFE) | | Nil | (g) 0.05 | (h) 0.10 | (i) 0.10 | (d) 0.50 |
| Concentration procedure and the concentration of the high concentration aqueous dispersion of PTFE | Method | Electrophoresis | Electrophoresis | Electrophoresis | Electrophoresis | Phase separation |
| | PTFE concentration (mass %) | 58.5 | 61.8 | 62.2 | 66.1 | 66.6 |
| | Surfactant concentration (mass %/PTFE) | 2.8 | 2.6 | 2.7 | 2.3 | 3.2 |
| | pH | 3.4 | 8.7 | 8.2 | 6.5 | 8.8 |
| Additive added after concentration | Nonionic surfactants and the amounts thereof (mass %/PTFE) | (a) 7.2 | (a) 7.2 | (a) 7.2 | (a) 7.2 | (a) 6.5 |
| | Fluorine-containing carboxylic acid and the amount thereof (mass %/PTFE) | Nil | Nil | Nil | Nil | (d) 0.05 |
| | Other additives and the amounts thereof (mass %/PTFE) | (j) 0.02 (k) 0.05 | (j) 0.02 (k) 0.05 | (j) 0.02 (k) 0.05 | (j) 0.02 (k) 0.05 | (j) 0.02 (k) 0.05 |
| Properties of aqueous dispersion of PTFE after blending | PTFE concentration (mass %) | 55.1 | 55.4 | 55.4 | 55.5 | 55.2 |
| | Surfactant concentration (mass %/PTFE) | 10.0 | 9.8 | 9.9 | 9.5 | 9.7 |
| | APFO concentration (mass %/PTFE) | 0.0060 | 0.0052 | 0.0056 | 0.0051 | 0.0047 |
| | Additives and the detected concentration (mass %/PTFE) | — | (g) 0.043 | (h) 0.068 | (i) 0.075 | (d) 0.376 |
| | Viscosity at 23° C. (mPa·s) | 82 | 62 | >100 | 22 | >100 |
| | pH | 9.4 | 9.6 | 9.9 | 9.3 | 9.5 |
| | Critical cracking thickness (μm) | 16.8 | 17.2 | 16.1 | 22.3 | 25.6 |
| | Agglomerates generated after friction stability test (g) | 4.41 | 4.24 | 4.51 | 1.41 | 0.71 |
| Coating test on glass fiber cloth | Color | White | White | White | Dark brown | White |
| | Cracking | Occurred | Occurred | Occurred | Not occurred | Occurred |
| | L* | −1.75 | −2.11 | −1.42 | −11.32 | −1.42 |
| | a* | 0.23 | 0.12 | 0.16 | 2.26 | 0.42 |
| | b* | 0.31 | 0.34 | 0.25 | 6.27 | 0.49 |
| Electrical conductivity after elution test (μS) | | <1 | 4 | <1 | 11 | <1 |
| Evaluation | | *1 | *1 | *1 | *2 | *3 |

*1 Unfavorable in viscosity, critical cracking thickness, friction stability and cracking
*2 Unfavorable in coating color and electrical conductivity
*3 Too high in viscosity and unfavorable in cracking

TABLE 3

| No. | Structural formula of additives | Molecular weight or formula weight |
|---|---|---|
| (a) | $C_{12}H_{25}$—O—$(C_2H_4O)_9$—OH | 598 |
| (b) | $C(CH_3)_3CH_2C(CH_3)_2(C_6H_4)$—$(OC_2H_4)_{10}$—OH | 610 |
| (c) | $C_{13}H_{27}$—$(OC_2H_4)_8$—O—$CH(CH_3)CH_2$—OH | 646 |
| (d) | $C_5F_{11}$—$COONH_4$ | 331 |
| (e) | $(CF_3)_2CF(CH_2)_2COONH_3(C_2H_4OH)$ | 303 |
| (f) | $C_2F_5OC_2F_4OCF_2COONH_4$ | 363 |
| (g) | $C_3F_7COONa$ | 236 |
| (h) | $C_5H_{11}COONH_4$ | 133 |
| (i) | $C_{12}H_{25}$—$SO_3Na$ | 272 |
| (j) | Polyethylene oxide | 500,000 on average (average) |
| (k) | 28 mass % aqueous ammonia ($NH_3$) | 17 |

INDUSTRIAL APPLICABILITY

The aqueous dispersion of PTFE of the present invention has many uses for electronic materials such as printed boards, roofing materials for membranous buildings and surface coatings for cooking utensils, and as PTFE fibers after spinning, dust prevention use, binders for active materials in batteries and additives for plastics.

The entire disclosure of Japanese Patent Application No. 2005-203953 filed on Jul. 13, 2005 including specification, claims, drawings and summary is incorporated herein by reference in its entirety.

What is claimed is:

1. An aqueous dispersion of polytetrafluoroethylene comprising:
   from 55 to 70 mass % of polytetrafluoroethylene fine particles having an average particle diameter of from 0.1 to 0.5 μm,
   from 0.0001 to 0.02 mass %, based on polytetrafluoroethylene, of a fluorine-containing carboxylic acid salt represented by the formula (1),
   from 1 to 20 mass %, based on polytetrafluoroethylene, of a nonionic surfactant represented by the formula (2) and/or the formula (3), and
   from 0.01 to 0.3 mass %, based on polytetrafluoroethylene, of a fluorine-containing carboxylic acid salt represented by the formula (4);
   wherein formulas (1)-(4) are:
   formula (1): $R^1$—COOX, wherein $R^1$ is a $C_7$ alkyl group having fluorine atoms instead of from 90 to 100% of the hydrogen atoms (which may contain from 1 to 2 ether oxygen atoms), and X is an ammonium ion;
   formula (2): $R^2$—O-A-H, wherein $R^2$ is a $C_{8-18}$ alkyl group, and A is a polyoxyalkylene chain consisting of from 5 to 20 oxyethylene groups and from 0 to 2 oxypropylene groups;
   formula (3): $R^3$—$C_6H_4$—O—B—H, wherein $R^3$ is a $C_{4-12}$ alkyl group, and B is a polyoxyalkylene chain consisting of from 5 to 20 oxyethylene groups; and
   formula (4): $R^4$—COOY, wherein $R^4$ is a $C_{4-6}$ alkyl group having fluorine atoms replacing from 30 to 100% of the hydrogen atoms and which may contain from 1 to 2 ether oxygen atoms, and Y is a cationic group represented by the formula $\{HO(CH_2)_n\}_z N^+ H_{4-z}$, wherein n is an integer of from 2 to 4, and z is an integer of from 0 to 4.

2. The aqueous dispersion of polytetrafluoroethylene according to claim 1, comprising a fluorine-containing carboxylic acid salt represented by the formula (1) that is perfluorocarboxylic ammonium.

3. The aqueous dispersion of polytetrafluoroethylene according to claim 1, comprising a nonionic surfactant represented by the formula (2), where $R^2$ is a $C_{12-16}$ alkyl group, and A is a hydrophilic polyoxyalkylene chain consisting of from 7 to 12 oxyethylene groups and from 0.5 to 1.5 polyoxypropylene groups.

4. The aqueous dispersion of polytetrafluoroethylene according to claim 1, comprising a nonionic surfactant represented by the formula (3), where $R^3$ is a $C_{6-10}$ alkyl group, and B is a hydrophilic group consisting of from 7 to 12 oxyethylene groups.

5. The aqueous dispersion of polytetrafluoroethylene according to claim 1, comprising a fluorine-containing carboxylic acid salt represented by the formula (4), where $R^4$ is a $C_4$ alkyl group.

6. The aqueous dispersion of polytetrafluoroethylene according to claim 1, comprising a fluorine-containing carboxylic acid salt represented by the formula (1) that is ammonium perfluorohexanoate.

7. The aqueous dispersion of polytetrafluoroethylene according to claim 1, comprising a fluorine-containing carboxylic acid salt represented by the formula (4) that is ammonium perfluorohexanoate.

8. The aqueous dispersion of polytetrafluoroethylene of claim 1, which contains a compound of formula (4), where $R^4$ is a $C_{4-6}$ alkyl group that contains 1-2 ether oxygen atoms.

9. The aqueous dispersion of polytetrafluoroethylene of claim 1, which contains a compound of formula (4), where $R^4$ is a $C_{4-6}$ alkyl group that does not contain ether oxygen atoms.

10. The aqueous dispersion of polytetrafluoroethylene of claim 1, which contains a compound of formula (4), wherein $R^4$ is a $C_5$ alkyl group.

11. The aqueous dispersion of polytetrafluoroethylene of claim 1, which contains a compound of formula (4), wherein $R^4$ is a $C_6$ alkyl group.

12. The aqueous dispersion of polytetrafluoroethylene of claim 1, which contains a compound of formula (4), wherein Y is a cationic group represented by the formula $\{HO(CH_2)_n\}_z N^+ H_{4-z}$, wherein z is an integer of 0.

13. The aqueous dispersion of polytetrafluoroethylene of claim 1, which contains a compound of formula (4), wherein Y is a cationic group represented by the formula $\{HO(CH_2)_n\}_z N^+ H_{4-z}$, wherein z is an integer of 1.

14. The aqueous dispersion of polytetrafluoroethylene of claim 1, which contains a compound of formula (4), wherein Y is a cationic group represented by the formula $\{HO(CH_2)_n\}_z N^+ H_{4-z}$, wherein z is an integer of 2.

15. The aqueous dispersion of polytetrafluoroethylene of claim 1, which contains a compound of formula (4), wherein Y is a cationic group represented by the formula $\{HO(CH_2)_n\}_z N^+ H_{4-z}$, wherein z is an integer of 3.

16. The aqueous dispersion of polytetrafluoroethylene of claim 1, which contains a compound of formula (4), wherein Y is a cationic group represented by the formula $\{HO(CH_2)_n\}_z N^+ H_{4-z}$, wherein z is an integer of 4.

17. The aqueous dispersion of polytetrafluoroethylene of claim 1, which contains at least one compound of formula (4) selected from the group consisting of $C_4F_9COONH_4$, $C_5F_{11}COONH_4$, $C_6F_{13}COONH_4$ and $HC_5F_{10}COONH_4$.

18. The aqueous dispersion of polytetrafluoroethylene of claim 1, which contains at least one compound of formula (4) selected from the group consisting of $(CF_3)_2CF(CH_2)_2COONH_3(C_2H_4OH)$, $C_5F_{11}COONH_3C_2H_4OH$, and $HC_5F_{10}COONH(C_2H_4OH)_3$.

19. The aqueous dispersion of polytetrafluoroethylene of claim 1, which contains at least one compound of formula (4) selected from the group consisting of $C_4F_9OCF_2COONH_4$ and $C_2F_5OC_2F_4OCF_2COONH_4$.

20. A product comprising a coating produced using the dispersion of polytetrafluoroethylene of claim 1.

* * * * *